(12) United States Patent
Miki

(10) Patent No.: US 9,735,801 B1
(45) Date of Patent: Aug. 15, 2017

(54) SIGMA-DELTA MODULATOR WITH AVERAGED-SIGNAL FEEDBACK

(71) Applicant: Takashi Miki, Tokyo (JP)

(72) Inventor: Takashi Miki, Tokyo (JP)

( * ) Notice: Subject to any disclaimer, the term of this patent is extended or adjusted under 35 U.S.C. 154(b) by 0 days.

(21) Appl. No.: 15/403,683

(22) Filed: Jan. 11, 2017

Related U.S. Application Data

(60) Provisional application No. 62/388,285, filed on Jan. 22, 2016.

(51) Int. Cl.
*H03M 3/00* (2006.01)

(52) U.S. Cl.
CPC ............. *H03M 3/42* (2013.01); *H03M 3/464* (2013.01)

(58) Field of Classification Search
CPC ................................ H03M 3/42; H03M 3/464
USPC .................................................. 341/143, 155
See application file for complete search history.

(56) References Cited

U.S. PATENT DOCUMENTS

| | | | |
|---|---|---|---|
| 7,420,494 B1 * | 9/2008 | Schreier | H03M 3/42 341/143 |
| 7,564,391 B2 | 7/2009 | Das | |
| 7,916,054 B2 | 3/2011 | Baker | |

OTHER PUBLICATIONS

Weaver, S., Hershberg, B., Kurahashi, P., Knierim, D., & Moon, U. K. (2010). Stochastic flash analog-to-digital conversion. IEEE Transactions on Circuits and Systems I: Regular Papers, 57 (11), 2825-2833.

José Luis Ceballos et al., "Stochastic analog-to-digital conversion." Circuits and Systems, 2005. 48th Midwest Symposium on. IEEE, 2005, 4 pages (855-858).

* cited by examiner

*Primary Examiner* — Khai M Nguyen
(74) *Attorney, Agent, or Firm* — IP Business Solutions, LLC

(57) ABSTRACT

A sigma-delta modulator includes a plurality of quantizers, an input path, a feedback path, a loop filter, a pre-filter, and a connection path. The plurality of quantizers are configured to produce a plurality of quantized signals. The input path is configured to lead an input signal to the plurality of quantizers. The feedback path is configured to feed back a feedback signal into the input path, and the feedback signal is produced by averaging the plurality of quantized signals. The loop filter is put on the input path before the plurality of quantizers, and the loop filter is configured to receive the input signal and the feedback signal. The pre-filter is configured to output a signal to a corresponding quantizer which is one of the plurality of quantizers.

3 Claims, 7 Drawing Sheets

SIGMA-DELTA MODULATOR WITH AVERAGED-SIGNAL FEEDBACK

BACKGROUND OF THE INVENTION

There have been various types of analog-to-digital converters (ADC), one of them utilizes a sigma-delta modulator. A sigma-delta modulator includes a quantizer that converts analog signals into digital signals. Not only single-bit but also multibit quantizer has been used for sigma-delta modulators. The use of multibit quantizer can mitigate the problem of instability especially for a single-loop sigma-delta modulator and can help to improve a signal-to-noise ratio (SNR) or signal-to-noise and distortion ratio (SNDR). A major drawback associated with the use of a multibit quantizer in a sigma-delta modulator is non-linearity, which is caused when the output signal from the quantizer is converted to an analog signal by a digital-to-analog converter (DAC) on the feedback loop.

SUMMARY

The technology disclosed here is a sigma-delta modulator. The sigma-delta modulator includes a plurality of quantizers, an input path, a feedback path, a loop filter, a pre-filter, and a connection path. The plurality of quantizers are configured to produce a plurality of quantized signals. The input path is configured to lead an input signal to the plurality of quantizers. The feedback path is configured to feed back a feedback signal into the input path, and the feedback signal is produced by averaging the plurality of quantized signals. The loop filter is put on the input path before the plurality of quantizers, and the loop filter is configured to receive the input signal and the feedback signal. The pre-filter is configured to output a signal to a corresponding quantizer which is one of the plurality of quantizers. The pre-filter is put on the input path between the loop filter and the corresponding quantizer, and the pre-filter is configured to receive one of the quantized signals that is output from one of the plurality of quantizers which is different form the corresponding quantizer. The connection path is configured to lead the quantized signal from the quantizer which is different form the corresponding quantizer to the pre-filter, and the connection path is configured not to touch the feedback path.

DETAILED DESCRIPTION OF THE TECHNOLOGY

Figure 1:
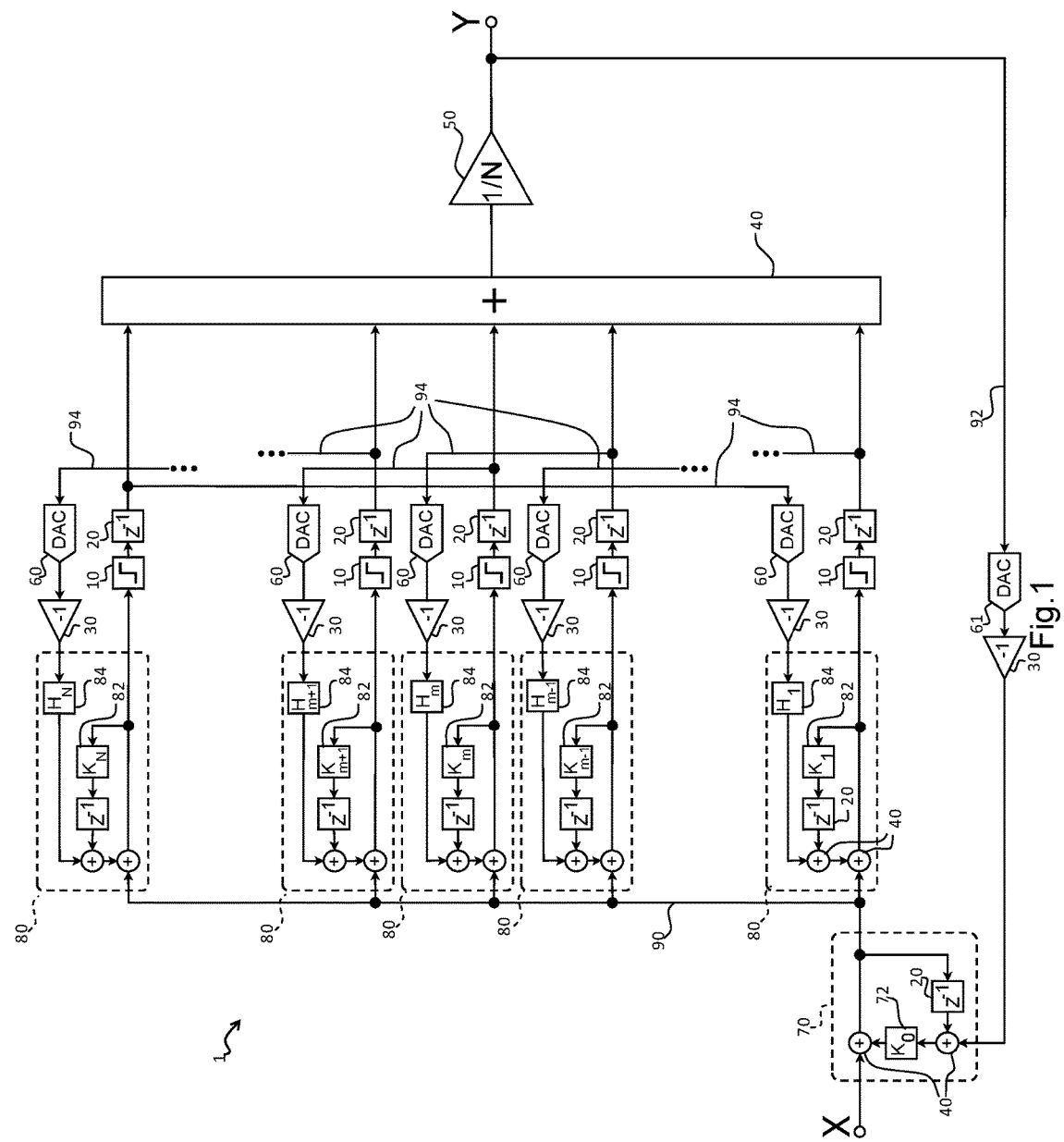
FIG. 1 is a block diagram showing the sigma-delta modulator 1.

The sigma-delta modulator 1 in FIG. 1 has N of quantizers 10 (an example of a plurality of quantizers), delays 20, inverters 30, summers 40, a divider 50, DACs 60, DAC 61, a loop filter 70, N of pre-filters 80, input path 90, feedback path 92, and N of connection paths 94. N is a positive integer and is sixteen in this embodiment. The quantizer 10 (an example of a quantizer) assigns one of predefined values to the signal that is input to the quantizer 10 and outputs the assigned value as the output signal (an example of a quantized signal). This conversion is so called quantization of a signal. In the present embodiment, the quantizer 10 is a single-bit quantzer. The quantizer 10 outputs either value of 1V, −1V, and 0V. The quantized signal is 1V when the pre-conversion signal, which is the signal that is input to the quantizer 10, is larger than 0V, −1V when the pre-conversion signal is less than 0V, and 0V when the pre-conversion signal is 0V. The quantizer 10 carries out one quantization process at every cycle that is equivalent to the reciprocal of the sampling frequency fs (Hz). In other words, the sampling frequency corresponds to the period at which the quantizer 10 refreshes the quantized signal, and this period is called the sampling period. A comparator, which is a combination of a latched comparator and a flip-flop, can be used to realize the single-bit quantizer.

Each of the delays 20 is configured to receive a signal and output the signal after delaying it by one sampling period. Each of the inverters 30 flips the sign of signals that pass through. Each of the summers 40 sums up the signals that are input into it. The divider 50 divides the signal that is input by N, the number of the quantizers 10. Each of the DACs 60 converts a digital signal to an analog signal. The input path 90 leads the input signal X to each of the quantizers 10. The quantized signals from the quantizers 10 are averaged by being summed up by the summer 40 and divided by the divider 50. The output signal of the divider 50 is the output signal Y, and it is also the feedback signal Y. The DAC 61 converts the feedback signal, a digital signal, to an analog signal. The feedback path 92 feeds back the feedback signal Y to the input path 90.

The loop filter 70 has a delay 20, summers 40, and a filter 72. The loop filter 70 is a unit that process signals so that the sigma-delta modulator 1 has a desired order of noise-shaping. The loop filter 70 is put on the input path 90 before the quantizers 10, and the loop filter 70 receives the input signal X and the output signal Y as the feedback signal. In this embodiment, the modulator is designed so that the quantization noise is shaped in the second order and that the zeros of the noise transfer function locate at DC. Thus, the filter 72 has the transfer function, $K_0(Z)$, as in equation (1).

$$K_0(Z)=2-Z^{-1} \quad (1)$$

The loop filter 70 is configured to integrate the difference between the input signal X and the feedback signal Y. In other words, the loop filter 70 is configured to be a low-pass filter filtering the difference between the input signal X and the feedback signal Y.

Each of the pre-filters 80 has a delay 20, summers 40, a filter 82, and a filter 84. Each of the pre-filters 80 outputs a signal to a corresponding quantizer 10 which directly follows the pre-filter 80, and the specific pre-filter 80 is put on the input path 90 between the loop filter 70 and the corresponding quantizer 10. Each of the pre-filters 80 receives the quantized signal that is output from one of the quantizers 10 which is different from the corresponding quantizer 10. For example, the m th pre-filter 80 in FIG. 1 receives the quantized signal that is output from the quantizer 10 which corresponds to the m−1 th pre-filter 80, where m is 2, 3, . . . , N−1. Also, the first pre-filter 80 receives the quantized signal that is output from the quantizer 10 which corresponds to the N th pre-filter 80. Each of the connection paths 94 leads the quantized signal from one of the quantizers 10 which is different from the corresponding quantizer 10 of a pre-filter 80 to the pre-filter 80. None of the connection paths 94 touches the feedback path 92. In other words, there are paths through which the quantized signals are provided into the pre-filters 80 without passing along the feedback path 92. The transfer functions of the filter 82 and filter 84 of the nth pre-filter 80 are $K_n(Z)$ and $H_n(Z)$, respectively, where n is 1, 2, . . . , N. The transfer functions $K_n(Z)$ and $H_n(Z)$ can be chosen in any way as long as the quantization noises from the quantizers 10 are sufficiently uncorrelated with each other and as long as the sigma-delta modulator 1 is stable. For example, $K_n(Z)$ and $H_n(Z)$ could be a first, second, or higher order low-pass, all-pass, or other type of filter. In this embodiment, a constant is assigned to each of $H_n(Z)$ and $K_n(Z)$ as in equations (2) and (3).

$$K_n(Z) = a_n, (n=1, 2, \ldots, N) \tag{2}$$

$$H_n(Z) = b_n, (n=1, 2, \ldots, N) \tag{3}$$

The constants $a_m$ and $b_m$ are determined so that the SNR which can be achieved is maximized and so that distortion is suppressed, which maximize the SNDR. It should be noted that the n th connection path 94 is cut when $b_n$ is zero. Also, the pre-filter 80 works as a weighted summer when $a_n$ is zero.

Figure 2:
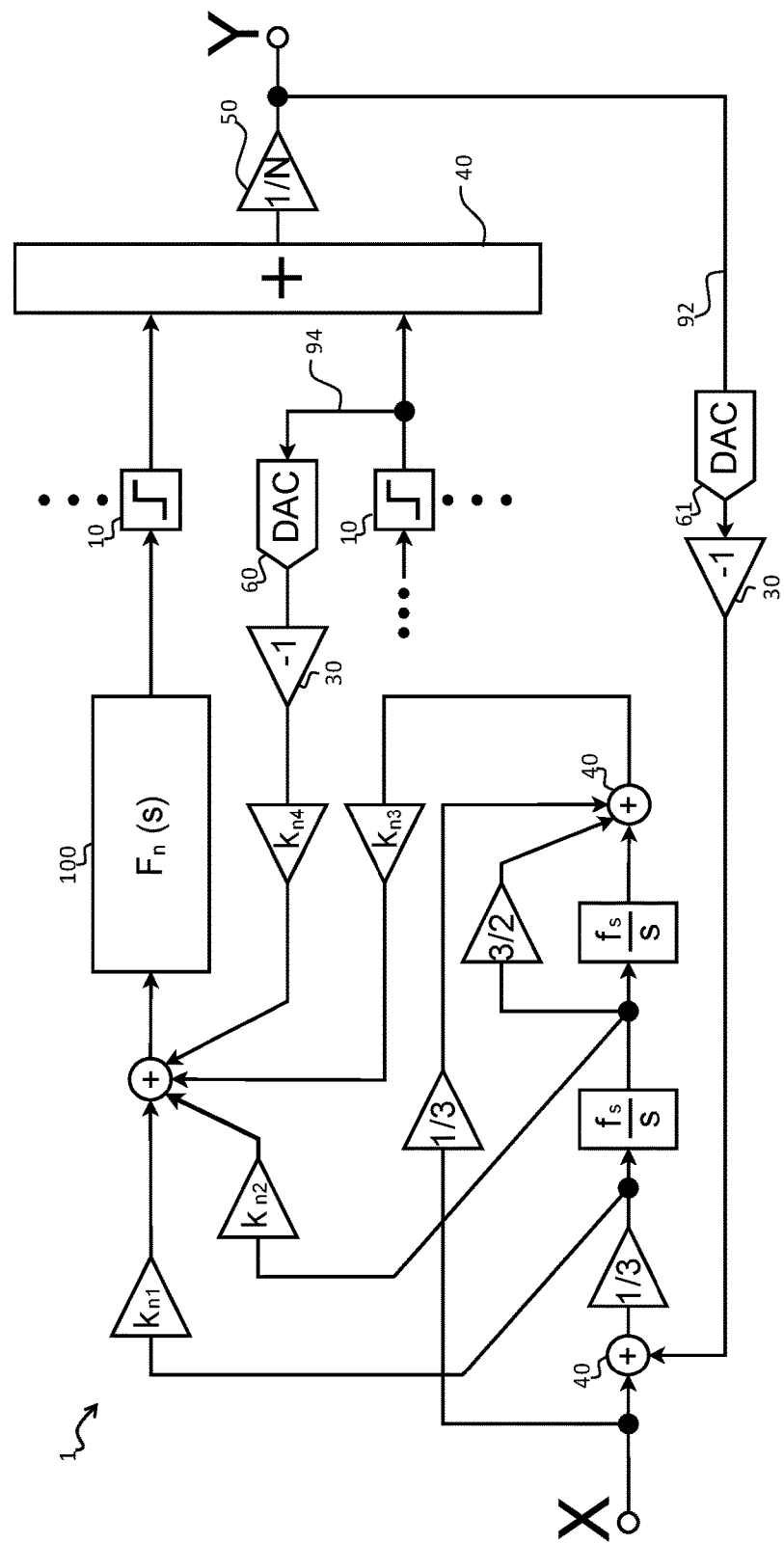
FIG. 2 is a block diagram showing the continuous time (CT) model of the sigma-delta modulator 1.

The sigma-delta modulator 1 can be implemented with a CT model by applying the impulse-invariant transform, and a non-return-to-zero (NRZ) DAC is assumed in this embodiment. FIG. 2 shows the CT model of the sigma-delta modulator 1. The gains $k_{n1}$, $k_{n2}$, $k_{n3}$, and $k_{n4}$ are expressed as in equations (4) to (7), where n is 1,2, . . . , N.

$$k_{n1} = 3\left[-\frac{2-3a_n}{(1-a_n)\ln(a_n)} + \frac{1}{2\ln(a_n)} + \frac{a_n(2a_n-1)}{(1-a_n)^2}\right] \tag{4}$$

$$k_{n2} = 3\left[-2 + \frac{2-3a_n}{1-a_n} - \frac{1}{\ln(a_n)}\right] \tag{5}$$

$$k_{n3} = 3 \tag{6}$$

$$k_{n4} = b_n \tag{7}$$

The transfer function 100, $F_n(s)$, has the expression in equation (8).

$$F_n(s) = \frac{-f_s \ln(a_n)}{(1-a_n)[s - f_s \ln(a_n)]} \tag{8}$$

Figure 3:
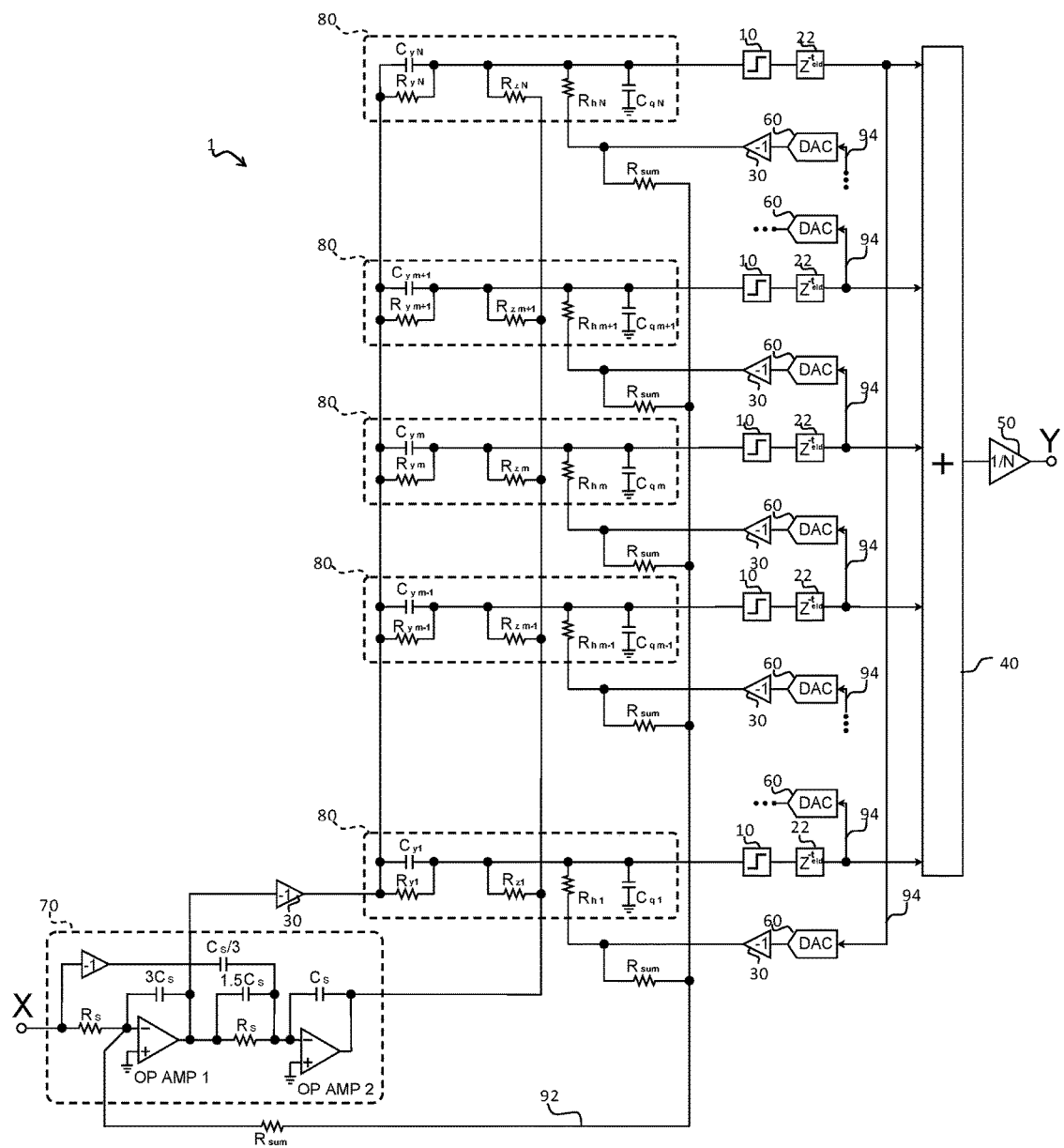
FIG. 3 is a schematic diagram showing the RC network to realize the CT model of the sigma-delta modulator 1.
Figure 4:
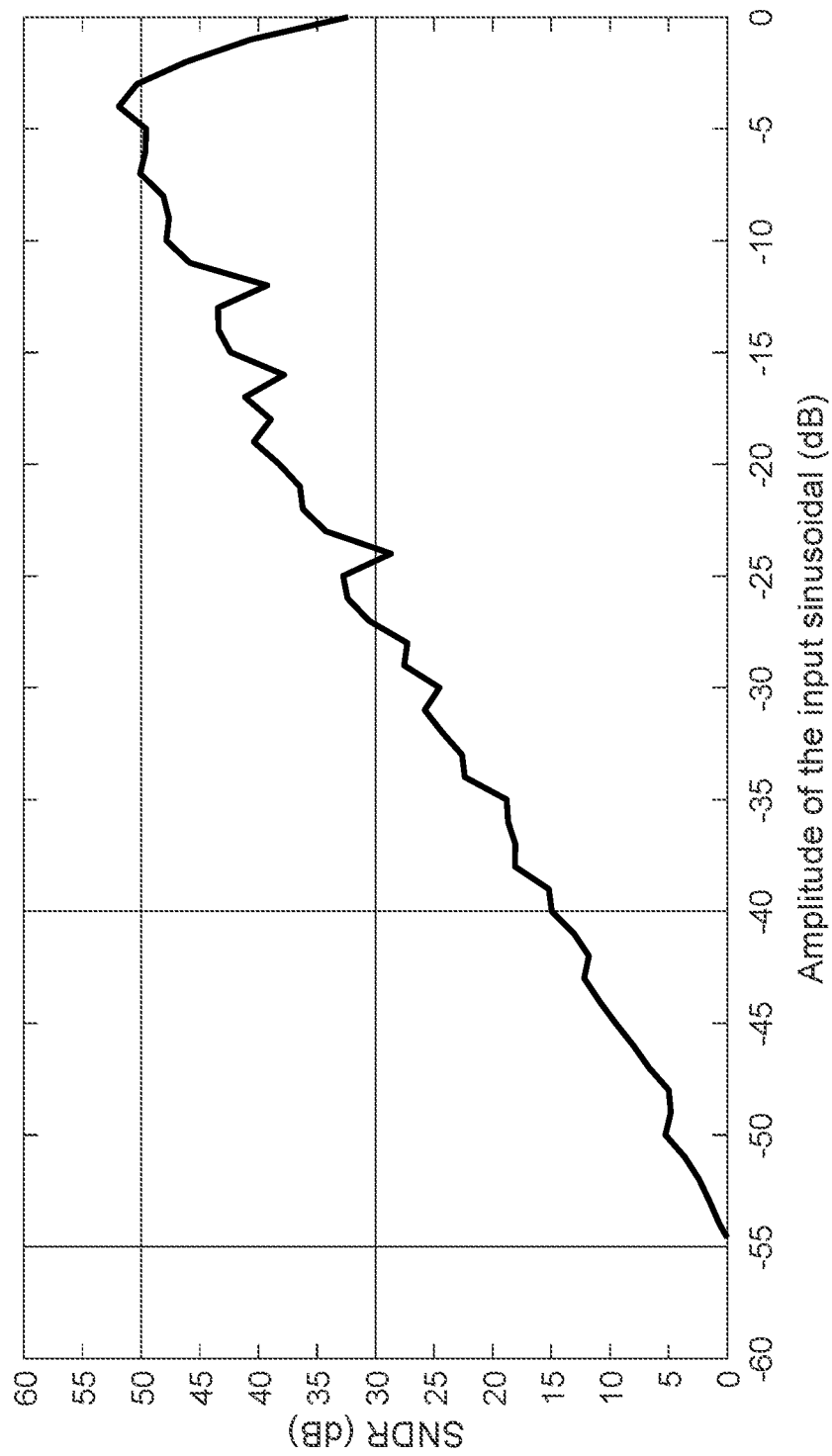
FIG. 4 is a plot of the SNDR that is gained with the sigma-delta modulator 1 in FIG. 3 with respect to the amplitude of the input sinusoidal.

The CT model in FIG. 2 can be realized by the RC network shown in FIG. 3. The excess loop-delays 22 represent the time that is taken for the quantizers 10 to quantize signals and for the DACs 60 to convert the quantized signals into equivalent analog signals. The resistors $R_S$ and $R_{sum}$ are provided to produce the feedback signal Y by averaging the quantized signals and to take a difference between the feedback signal Y and the input signal X. It should be noted that the DAC 61, a multi-bit DAC, is eliminated. In generating the feedback signal Y, the functions of the summer 40, divider 50, and the DAC 61 are fulfilled by the combination of the resistors $R_s$, and $R_{sum}$. The resistors $R_S$ and the capacitor $C_S$ are the components to implement the loop filter 70 together with the two opamps. The resistors $R_{hn}$, $R_{yn}$, $R_{zn}$, and the capacitors $C_{y2}$, where n=1, 2, . . . N, are used to form the pre-filters 80. The SNDR of the modulator 1 with respect to the input amplitude when the input signal is a sinusoidal and when the over-sampling ratio (OSR) is sixteen is shown in FIG. 4. The frequency of the input sinusoidal is the bandwidth of the sigma-delta modulator 1 multiplied by 337/1024 ($=f_s/16/2*337/1024$), which is slightly smaller than one third of the bandwidth of the sigma-delta modulator 1.

Figure 5:
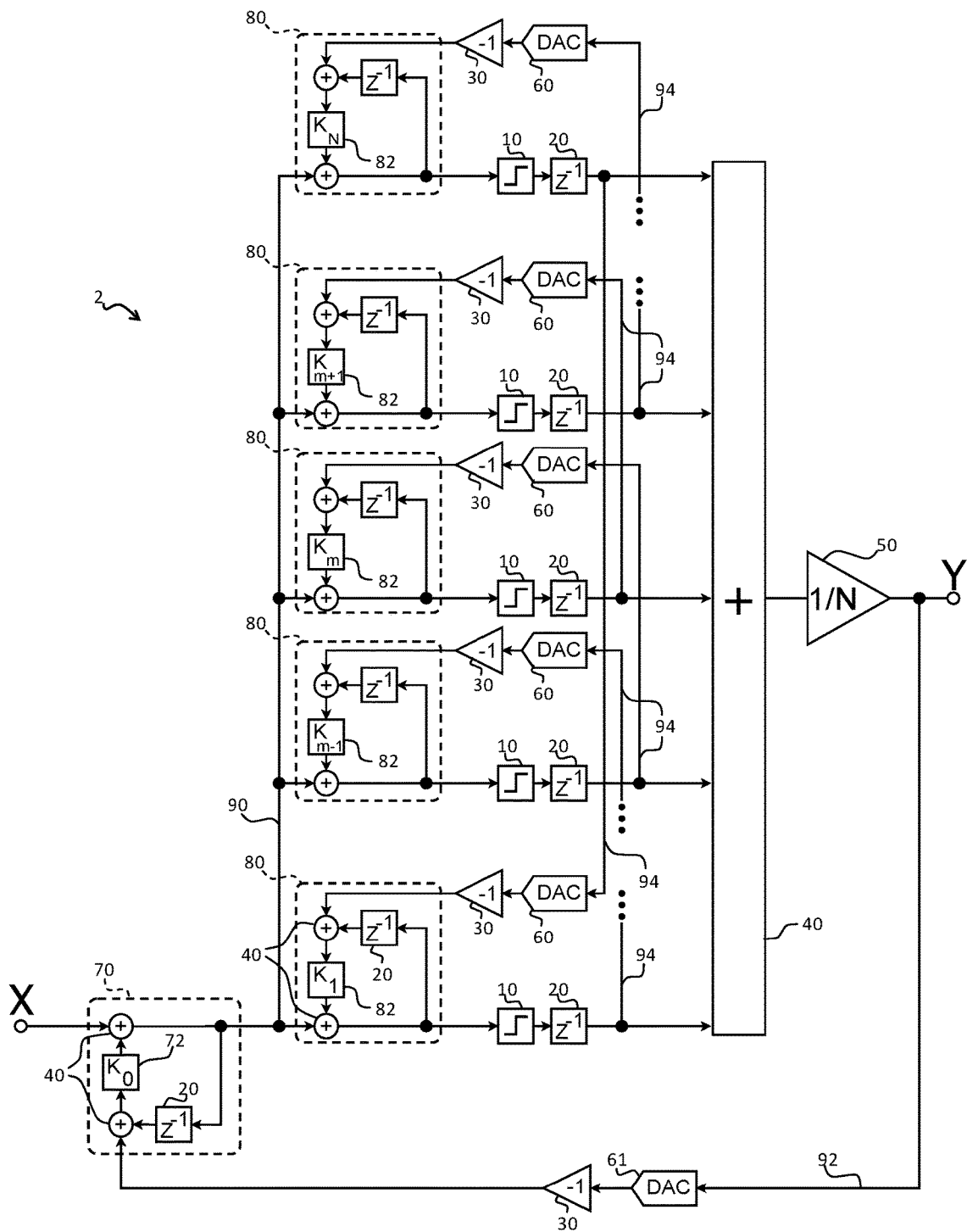
FIG. 5 is a block diagram showing the sigma-delta modulator 2.

Different types of filters can be used as the pre-filters 80. The sigma-delta modulator 2 in FIG. 5 shows one of the possible types of the pre-filters 80. The transfer functions of the filters 82 in the modulator 2 is a low-pass filter of first order that is expressed as in equation (9).

$$K_n(Z) = \alpha_n\left(\frac{1-\beta_n}{1-\beta_n Z^{-1}}\right), (n = 1, 2, \ldots, N) \tag{9}$$

Figure 6:
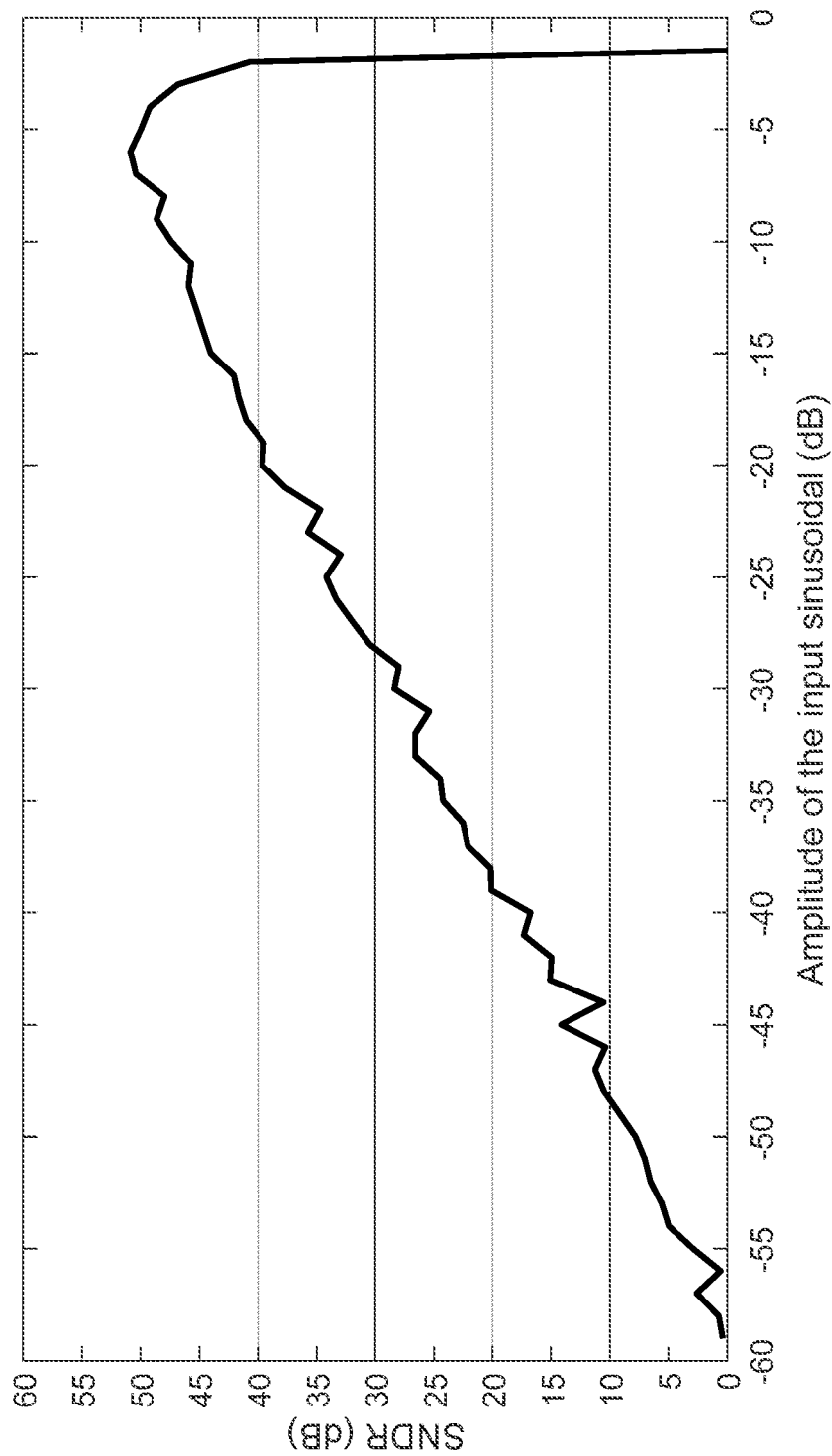
FIG. 6 is a plot of the SNDR that is gained with the sigma-delta modulator 2 in FIG. 5 with respect to the amplitude of the input sinusoidal.

When N is 8, the coefficients $\alpha_n$ and $\beta_n$ can be chosen such that the SNR which can be achieved is maximized and so that distortion is suppressed. The SNDR of the sigma-delta modulator 2 with respect to the input amplitude when the input signal is a sinusoidal and when the OSR is sixteen is shown in FIG. 6. The frequency of the input sinusoidal is the bandwidth times 337/1024. It should be noted that the transfer function of the part between the loop filter 70 and the feedback path 92 is $Z^{-1}$, and the topology of the modulator 2 is feed-forward type. Also, the signal transfer function of the sigma-delta modulator 2 is $Z^{-1}$.

Figure 7:
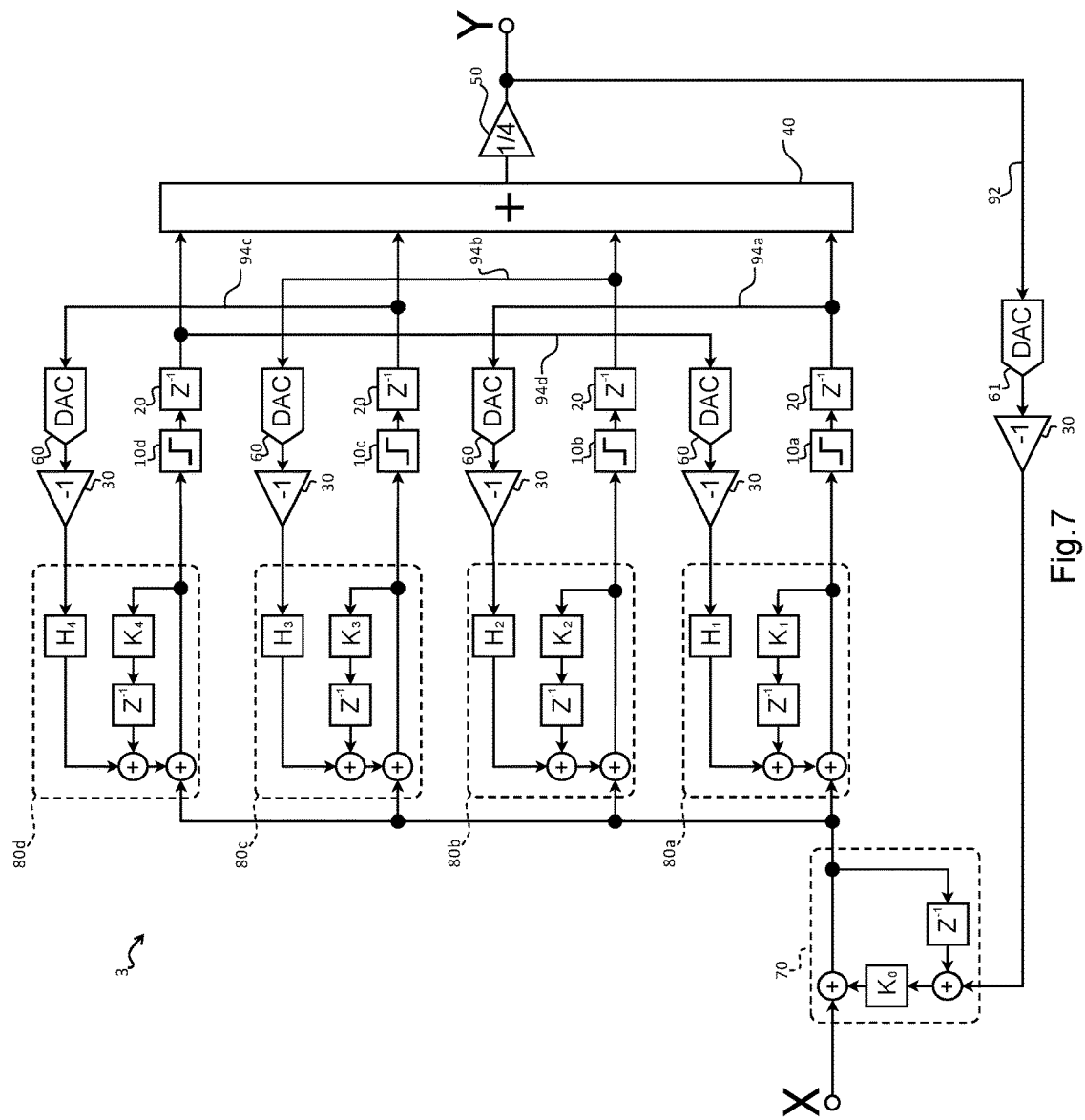
FIG. 7 is a block diagram showing the sigma-delta modulator 3 when N is four.

The number N which is the number of the quantizers 10 does not necessarily need to be sixteen and it can be any number. FIG. 7 shows the sigma-delta modulator 3 with N of four. The sigma-delta modulator 3 has the pre-filters 80a to 80d, quantizers 10a to 10d, and connection paths 94a to 94d. The pre-filter 80a is configured to output a signal to the quantizer 10a (an example of a corresponding quantizer) which is one of the plurality of quantizers 10a to 10d, the pre-filter 80a is put on the input path 90 between the loop filter 70 and the corresponding quantizer 10a, and the pre-filter 80a is configured to receive the quantized signal that is output from the quantizer 10d (an example of one of the plurality of quantizers which is different form the corresponding quantizer). The connection path 94a is configured to lead the quantized signal from the quantizer 10d to the pre-filter 80a, and the connection path 94a is configured not to touch the feedback path 92.

The quantizers 10 do not always need to be a single-bit quantizer, and multibit quantizers are usable in order to gain the effect of reducing the quantizerion noise by averaging the quantized signals. The quantized signals can take any types of signal such as a voltage, current, and phase. If the quantizer 10 is a voltage-to-time converter, the quantize signal will be a phase. The implementation that has been shown previously is only an example, and the technology that has been detailed above may be implemented in any way which is available. For example, the sigma-delta modulator 1 can be implemented with a discrete-time model using the technique of switched capacitors. The feedback signal Y, which is equivalent to the output signal Y, can be a weighted-average of the quantized signals or can be a mere summation of the quantized signals. The filters can take different forms from those which have been shown above. The loop filter 70 will be changed according to the specification that is required, which will concern with the SNR, SNDR, spurious free dynamic range (SFDR), the order of a sigma-delta modulator, stability of the modulator, and the output swing of the integrators in the modulator, for example. The loop filter 70 does not necessarily have to have a gain larger than one, and it can be a low-pass filter with a gain of unity or smaller than one. The filters 82 and 84 are not necessarily a constant or first order filter and can be a different type of filter, and its order can be equal to or more than two.

The features of the technology that has been disclosed are explained below. The sigma-delta modulator 1 includes the plurality of quantizers 10, the input path 90, the feedback path 92, the loop filter 70, the pre-filter 80, and the connection path 94. The quantizers 10 are configured to produce a plurality of quantized signals. The input path 90 is configured to lead the input signal X to the quantizers 10. The feedback path 92 is configured to feed back the feedback signal Y into the input path 90, and the feedback signal Y is produced by averaging the plurality of quantized signals. The loop filter 70 is put on the input path 90 before the quantizers 10, and the loop filter 70 is configured to receive the input signal X and the feedback signal Y. The pre-filter 80 is configured to output a signal to the corresponding quantizer 10. The pre-filter 80 is put on the input path 90 between the loop filter 70 and the corresponding quantizer 10, and the pre-filter 80 is configured to receive one of the quantized signals that is output from one of the quantizers 10 which is different from the corresponding quantizer 10. The connection path 94 is configured to lead the quantized signal from the quantizer 10 which is different from the corresponding quantizer 10 to the pre-filter 80, and the connection path 94 is configured not to touch the feedback path 92. Because of the system in which the pre-filter 80 receives a quantized signal from one of the quantizers 10 which is different form the quantizer 10 corresponding to the pre-filter 80, the quantized signals form the quantizers 10 become less correlated with each other. The variance of a signal that is obtained by averaging N uncorrelated signals is $1/N^{0.5}$ times smaller than the variance of each uncorrelated signal given that their variances are the same. For example, when N is sixteen, the quantization noise in the output signal Y, that is the feedback signal, will decrease by 12 dB. This 12 dB is derived as $-20*\log_{10}(1/16^{0.5})$. In addition, the DAC 61 on the feedback path 92 can be eliminated when every quantizer 10 is a single-bit quantizer, which will help to suppress non-linearity that is caused in the feedback loop because a single-bit quantizer is inherently linear. In other types of sigma-delta modulators with multiple quantizers such as multistage noise shaping (MASH), output signal is obtained by the subtraction between the signals from several quantizers. That process of subtraction is sensitive to the mismatch of the elements used in the circuits. Compared to subtraction, the process of averaging can be robust to the mismatch. As illustrated above, the pre-filters 80 in FIG. 3 includes only passive components such as resistors $R_{yn}$, $R_{zn}$, $R_{hn}$, and capacitors $C_{hn}$ (n=1, 2, . . . N). Active components such as opamps are not necessarily needed for the pre-filters 80, and this is an advantage of the sigma-delta modulator 1 in suppressing power consumption comparing with a sigma-delta modulator of a type in which additional active components are used.

What is claimed is:

1. A sigma-delta modulator, comprising:
   a plurality of quantizers configured to produce a plurality of quantized signals;
   an input path configured to lead an input signal to the plurality of quantizers;
   a feedback path configured to feed back a feedback signal into the input path, the feedback signal produced by averaging the plurality of quantized signals;
   a loop filter put on the input path before the plurality of quantizers, the loop filter configured to receive the input signal and the feedback signal;
   a pre-filter configured to output a signal to a corresponding quantizer which is one of the plurality of quantizers, the pre-filter put on the input path between the loop filter and the corresponding quantizer, and the pre-filter configured to receive one of the quantized signals that is output from one of the plurality of quantizers which is different from the corresponding quantizer;
   a connection path configured to lead the quantized signal from the quantizer which is different form the corresponding quantizer to the pre-filter, and the connection path configured not to touch the feedback path.

2. The sigma-delta modulator according to claim 1, wherein
   the plurality of quantizers are a single-bit quantizer.

3. The sigma-delta modulator according to claim 1, wherein
   the pre-filter includes only passive components.

\* \* \* \* \*